United States Patent
Azumo et al.

(10) Patent No.: US 12,540,394 B2
(45) Date of Patent: Feb. 3, 2026

(54) SELECTIVE FILM FORMATION USING SELF-ASSEMBLED MONOLAYER

(71) Applicant: TOKYO ELECTRON LIMITED, Tokyo (JP)

(72) Inventors: Shuji Azumo, Yamanashi (JP); Shinichi Ike, Gyeonggi-do (KR); Yumiko Kawano, Yamanashi (JP); Hiroki Murakami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 125 days.

(21) Appl. No.: 18/280,539

(22) PCT Filed: Feb. 24, 2022

(86) PCT No.: PCT/JP2022/007697
§ 371 (c)(1),
(2) Date: Sep. 6, 2023

(87) PCT Pub. No.: WO2022/190889
PCT Pub. Date: Sep. 15, 2022

(65) Prior Publication Data
US 2024/0150895 A1    May 9, 2024

(30) Foreign Application Priority Data
Mar. 9, 2021   (JP) ................................ 2021-037317

(51) Int. Cl.
*C23C 16/455*   (2006.01)
*C23C 16/18*    (2006.01)
(Continued)

(52) U.S. Cl.
CPC ........ *C23C 16/45529* (2013.01); *C23C 16/18* (2013.01); *C23C 16/345* (2013.01);
(Continued)

(58) Field of Classification Search
CPC ............ C23C 16/45529; C23C 16/345; C23C 16/401; C23C 16/4554; C23C 16/45553
See application file for complete search history.

(56) References Cited

U.S. PATENT DOCUMENTS 7,728,436 B2 *  6/2010  Whelan ................. B82Y 30/00
                                              257/E23.165
9,515,166 B2 * 12/2016  Nemani ............. H01L 21/0228
(Continued)

FOREIGN PATENT DOCUMENTS

JP    2007-501902 A    2/2007
JP    2007-533156 A   11/2007
(Continued)

OTHER PUBLICATIONS

Bobb-Semple, Dara, et al., "Area-Selective Atomic Layer Deposition Assisted by Self-Assembled Monolayers: A Comparison of Cu, Co, W, and Ru". Chemistry of Materials, 2019, 31, 1635-1645.*
(Continued)

*Primary Examiner* — Bret P Chen
(74) *Attorney, Agent, or Firm* — Nath, Goldberg & Meyer; Jerald L. Meyer

(57) ABSTRACT

A film forming method includes: a preparation process of preparing a substrate having a surface from which a first film without containing silicon and a second film are exposed; a first film formation process of forming a self-assembled monolayer, which has a fluorine-containing functional group and inhibits formation of a third film containing silicon, on the first film; a second film formation process of forming the third film on the second film; a modification process of decomposing the self-assembled monolayer by plasma using a gas containing hydrogen and nitrogen while maintaining a temperature of the substrate to be 70 degrees C. or lower, so that a side portion of the third film, which is formed in a vicinity of the self-assembled monolayer, is modified into
(Continued)

ammonium fluorosilicate by active species contained in the decomposed self-assembled monolayer; and a removal process of removing the ammonium fluorosilicate.

16 Claims, 15 Drawing Sheets

(51) Int. Cl.
  *C23C 16/34* (2006.01)
  *C23C 16/40* (2006.01)
  *C23C 16/52* (2006.01)
(52) U.S. Cl.
  CPC ........ *C23C 16/401* (2013.01); *C23C 16/4554* (2013.01); *C23C 16/45553* (2013.01); *C23C 16/52* (2013.01)

(56) References Cited

U.S. PATENT DOCUMENTS

| | | | | |
|---|---|---|---|---|
| 9,754,791 | B2* | 9/2017 | Godet | H10D 30/0241 |
| 10,770,292 | B2* | 9/2020 | Ke | H01L 21/02057 |
| 11,788,185 | B2* | 10/2023 | Azumo | C23C 16/52 427/255.27 |
| 2013/0309846 | A1* | 11/2013 | Pham | H10D 30/024 257/E21.09 |
| 2016/0126107 | A1* | 5/2016 | Kil | C09K 13/08 252/79.3 |
| 2019/0330741 | A1* | 10/2019 | Lee | C23C 16/45565 |
| 2020/0006057 | A1* | 1/2020 | Azumo | H01L 21/28562 |
| 2020/0176338 | A1* | 6/2020 | Nishimura | H01J 37/32972 |
| 2021/0020444 | A1* | 1/2021 | Tapily | H01L 21/76883 |
| 2021/0035814 | A1* | 2/2021 | Omi | H01L 21/31144 |

FOREIGN PATENT DOCUMENTS

| | | | | |
|---|---|---|---|---|
| JP | 2009-231799 | * | 10/2009 | ........... H01L 21/302 |
| JP | 4553049 | * | 7/2010 | ........... H01L 21/302 |
| JP | 2010-540773 A | | 12/2010 | |
| JP | 2013-520028 A | | 5/2013 | |
| JP | 2020-147792 | * | 9/2020 | ............ C23C 16/04 |

OTHER PUBLICATIONS

Cho, Hong Yeon, et al., "Site-selective Deposition of Graphene Oxide Layer on Patterned Self-assembled Monolayer". Chem. Lett. 2012, 41, 290-291.*

Wang, Changshun, et al., "Area-selective deposition of self-assembled monolayers on a synchrotron radiation etching pattern". Chinese Optics Letters, vol. 3, Supplement, Aug. 28, 2005, pp. S106-S108.*

Cheng, Chia-Wei, et al., "Achieving area-selective atomic layer deposition with fluorinated self-assembled monolayers". Journal of Materials Chemistry C, 2021, 9, 14589-14595.*

Shinoda, Kazunori, et al., "Thermal cyclic etching of silicon nitride using formation and desorption of ammonium fluorosilicate". Applied Physics Express 9, 106201 (2016) pp. 1-3.*

Miyoshi, Nobuya, et al., "Atomic layer etching of silicon nitride using infrared annealing for short desorption time of ammonium fluorosilicate". Japanese Journal of Applied Physics 56, 06HB01 (2017) pp. 1-7.*

G. S. Oehrlein, D. Metzler, and C. Li "Atomic Layer Etching at the Tipping Pint: An Overview" ECS J. Solid State Sci. Technol. 2015 vol. 4 No. 6 N5041-N5053.

Ming Fang and Johnny C. Ho "Areas-Selective Atomic Layer Deposition: Conformal Coating, Subnanometer Thickness Control, and Smart Positioning" ACS Nano, 2015, 9 (9), pp. 8651-8654.

Adriaan J. M. Mackus, Marc J. M. Merkx, and Wilhelmus M. M. Kessels "From the Bottom-Up: Toward Area-Slective Atomic Layer Deposition with High Slectivity" Chem. Mater., 2019, 31 (1), pp. 2-12.

Fatemeh Sadat Minaye Hashemi, Bradlee R. Birchansky, and Stacey F. Bent "Selective Deposition of Dielectrics: Limits and Advantages of Alkanethiol Blocking Agents on Metal-Dielectric Patterns" ACS Appl. Mater. Interfaces, 2016, 8 (48), pp. 33264-33272.

* cited by examiner

SELECTIVE FILM FORMATION USING SELF-ASSEMBLED MONOLAYER

This is a National Phase Application filed under 35 U.S.C. 371 as a national stage of PCT/JP2022/007697, filed Feb. 24, 2022, an application claiming the benefit of Japanese Application No. 2021-037317, filed Mar. 9, 2021, the content of each of which is hereby incorporated by reference in its entirety.

TECHNICAL FIELD

Various aspects and embodiments of the present disclosure relate to a film forming method and a film forming system.

BACKGROUND

In manufacturing semiconductor devices, a photography technique is widely used to selectively form a film in a specific region of a substrate surface. For example, an insulating film is formed after formation of a lower wiring, a dual damascene structure having trenches and via holes is formed by photolithography and etching, and a conductive film such as Cu is embedded in the trenches and the via holes to form a wiring.

However, in recent years, as miniaturization of semiconductor devices has progressed more and more, there are cases where sufficient position alignment accuracy is not achieved with the photolithography technique.

For this reason, there is a demand for a method of selectively forming a film in a specific region of a substrate surface without using the photolithography technique. As such a method, a technique of forming a self-assembled monolayer (SAM) in a region of a substrate surface where film formation is not desired has been proposed (see e.g., Patent Documents 1 to 4 and Non-Patent Documents 1 to 4). Since a predetermined film is not formed in the region of the substrate surface where the SAM is formed, it is possible to form the predetermined film only in a region of the substrate surface where the SAM is not formed.

PRIOR ART DOCUMENTS

Patent Documents

Patent Document 1: Japanese Patent Laid-Open Publication No. 2007-501902
Patent Document 2: Japanese Patent Laid-Open Publication No. 2007-533156
Patent Document 3: Japanese Patent Laid-Open Publication No. 2010-540773
Patent Document 4: Japanese Patent Laid-Open Publication No. 2013-520028

Non-Patent Documents

Non-Patent Document 1: G. S. Oehrlein, D. Metzler, and C. Li "Atomic Layer Etching at the Tipping Point: An Overview" ECS J. Solid State Sci. Technol. 2015 vol. 4 no. 6 N5041-N5053
Non-Patent Document 2: Ming Fang and Johnny C. Ho "Area-Selective Atomic Layer Deposition: Conformal Coating, Subnanometer Thickness Control, and Smart Positioning" ACS Nano, 2015, 9 (9), pp 8651-8654
Non-Patent Document 3: Adriaan J. M. Mackus, Marc J. M. Merkx, and Wilhelmus M. M. Kessels "From the Bottom-Up: Toward Area-Selective Atomic Layer Deposition with High Selectivity" Chem. Mater., 2019, 31 (1), pp 2-12
Non-Patent Document 4: Fatemeh Sadat Minaye Hashemi, Bradley R. Birchansky, and Stacey F. Bent "Selective Deposition of Dielectrics: Limits and Advantages of Alkanethiol Blocking Agents on Metal-Dielectric Patterns" ACS Appl. Mater. Interfaces, 2016, 8 (48), pp 33264-33272

SUMMARY

The present disclosure provides a film forming method and a film forming system capable of efficiently removing a portion of a film that protrudes from a region where film formation is desired to a region where the film formation is not desired.

One aspect of the present disclosure is a film forming method of selectively forming a film on a substrate, which includes a preparation process, a first film formation process, a second film formation process, a modification process, and a first removal process. In the preparation process, a substrate having a surface from which a first film without containing silicon and a second film are exposed is prepared. In the first film formation process, a self-assembled monolayer is formed on the first film by supplying a compound for forming the self-assembled monolayer, which has a fluorine-containing functional group and inhibits formation of a third film containing silicon, to the substrate. In the second film formation process, the third film is formed on the second film. In the modification process, the self-assembled monolayer is decomposed by plasma using a gas containing hydrogen and nitrogen while maintaining a temperature of the substrate to be 70 degrees C. or lower. Thus, a side portion of the third film, which is formed in a vicinity of the self-assembled monolayer, is modified into ammonium fluorosilicate by active species contained in the decomposed self-assembled monolayer. In the first removal process, the ammonium fluorosilicate is removed.

According to various aspects and embodiments of the present disclosure, it is possible to efficiently remove a portion of a film that protrudes from a region where film formation is desired to a region where the film formation is not desired.

DETAILED DESCRIPTION

Hereinafter, embodiments of a film forming method and a film forming system disclosed herein will be described in detail based on the drawings. In addition, the disclosed film forming method and film forming system are not limited by the following embodiments.

In conventional selective film formation, a substrate with a metal film and an insulating film exposed on a surface thereof is prepared, an SAM that inhibits formation of an oxide film is formed on the metal film, and an oxide film is formed on the insulating film. At this time, since the SAM inhibits an oxide film from being formed on the metal film, no oxide film is formed on the metal film.

However, in the course of formation of the oxide film on the insulating film, the oxide film grows in a thickness direction as well as in a lateral direction. As a thickness of the oxide film increases, a growth rate in the lateral direction of the oxide film also increases. Therefore, there are cases where a side portion of the oxide film protrudes to a region of the metal film, so that the region of the metal film is partially covered with the oxide film. When the region of the metal film is covered with the oxide film, in a case where an electrode connected to the metal film is formed in a subsequent process, the electrode becomes thinner in a vicinity of the oxide film protruding to the region of the metal film, which results in an increase in resistance value of the electrode. In addition, when a periphery of the metal film is surrounded by the insulating film, there are cases where the entire region of the metal film is covered with the oxide film protruding from the region of the insulating film.

Accordingly, the present disclosure provides a technique capable of efficiently removing a portion of a film that protrudes from a region where film formation is desired to a region where film formation is not desired.

[Film Forming System]

Figure 1:
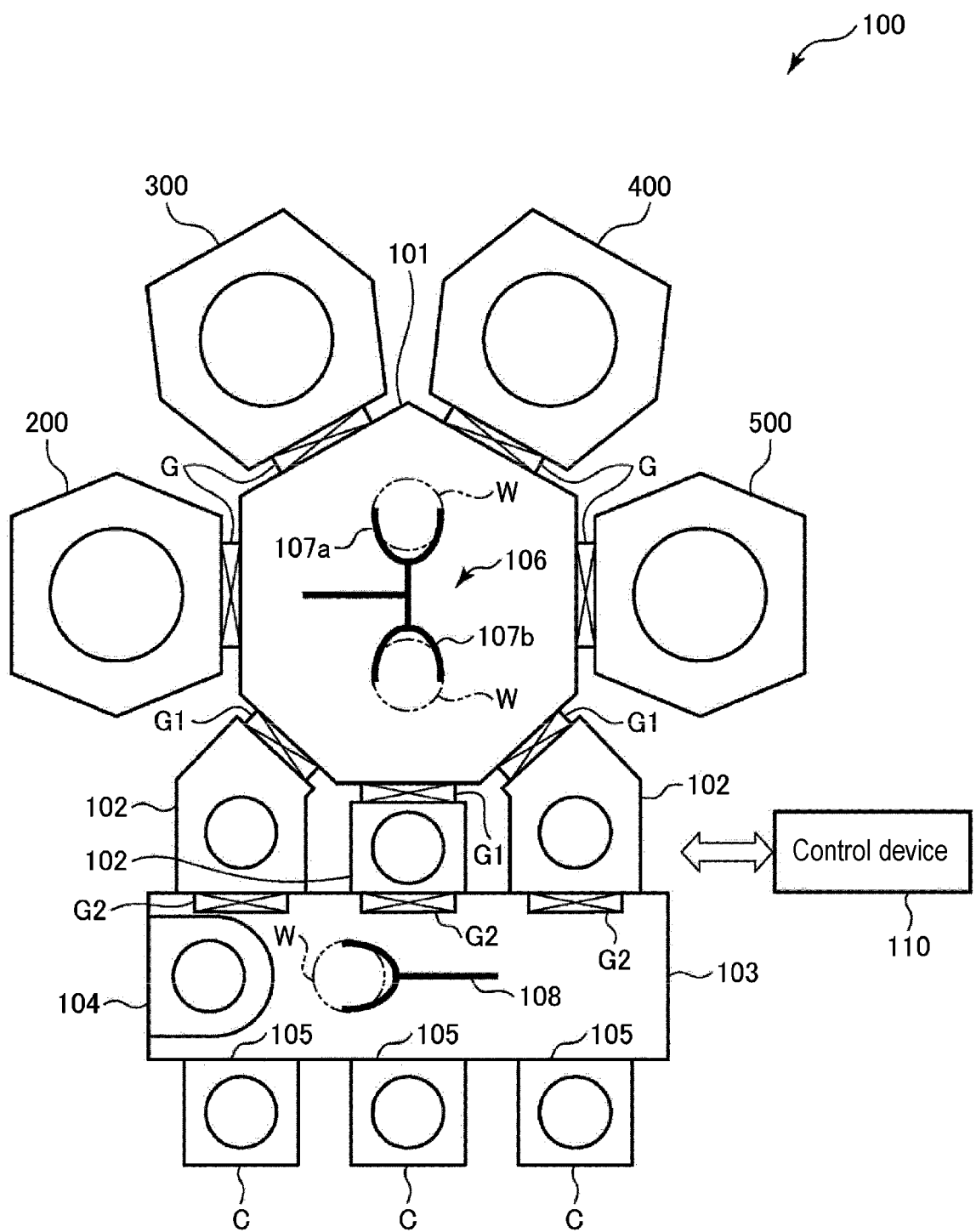
FIG. 1 is a schematic view illustrating an example of a film forming system according to an embodiment of the present disclosure.

FIG. 1 is a schematic view illustrating an example of a film forming system 100 according to an embodiment of the present disclosure. The film forming system 100 includes a plasma processing apparatus 200, an SAM supply apparatus 300, a film forming apparatus 400, and a heating apparatus 500. The plasma processing apparatus 200, the SAM supply apparatus 300, the film forming apparatus 400, and the heating apparatus 500 are examples of one or more processing apparatuses. These apparatuses are respectively connected to four sidewalls of a vacuum transfer chamber 101 having a heptagonal planar shape via gate valves G. The film forming system 100 is a multi-chamber-type vacuum processing system. An interior of the vacuum transfer chamber 101 is evacuated by a vacuum pump and is maintained at a predetermined degree of vacuum. The film forming system 100 utilizes the plasma processing apparatus 200, the SAM supply apparatus 300, the film forming apparatus 400, and the heating apparatus 500 to selectively form a third film containing silicon on a second film of a substrate W having a surface from which a first film without containing silicon and the second film are exposed. In the present embodiment, the first film is, for example, a metal film without containing silicon, the second film is, for example, an insulating film, and the third film is, for example, a dielectric film containing silicon.

The plasma processing apparatus 200 processes the surface of the substrate W with plasma. For example, in the substrate W having the surface from which the first film and the second film are exposed, the plasma processing apparatus 200 uses plasma to remove a layer (e.g., a native oxide film) containing impurities formed on a surface of the first film. In addition, the plasma processing apparatus 200 uses the plasma to decompose a self-assembled monolayer (hereinafter referred to as SAM), which is formed on the first film by the SAM supply apparatus 300 to be described later. The removal of the native oxide film and the decomposition of the SAM are performed using ions, active species, or others contained in the plasma by plasmarizing a gas including at least one of hydrogen gas, nitrogen gas, ammonia gas, or argon gas.

The SAM supply apparatus 300 supplies a gaseous organic compound for SAM formation to the surface of the substrate W, thereby forming the SAM in a region of the first film of the substrate W. The SAM in the present embodiment has a function of being adsorbed to a surface of the first film rather than being adsorbed to a surface of the second film, and also has a function of inhibiting formation of the third film.

In the present embodiment, the organic compound for SAM formation includes, for example, a binding functional-group that is adsorbed to the surface of the first film, a functional functional-group that contains fluorine, and an alkyl chain that connects the binding functional-group to the functional functional-group.

When the first film is formed of, for example, gold or copper, a thiol-based compound represented by a chemical formula of "R—SH" may be used as the organic compound for SAM formation. Here, "R" includes a fluorine atom and a carbon atom. The thiol-based compound has a property of being adsorbed to a surface of a metal such as gold or copper without being adsorbed to a surface of an oxide or carbon. Examples of the thiol-based compound may include $CF_3(CF_2)_XCH_2CH_2SH$, $CF_3(CF_2)_XCH_2CH_2PO(OH)_2$, $HS—(CH_2)_{11}—O—(CH_2)_2—(CF_2)_5—CF_3$, and $HS—(CH_2)_{11}—O-CH_2-C_6F_5$. In addition, in the above-described composition formulas, X is an integer of 1 to 7.

In addition, when the first film is formed of, for example, an aluminum oxide or a hafnium oxide, an organic silane-based compound represented by a chemical formula of "R—Si(OCH_3)_3" or "R—SiCl_3" may be used as the organic compound for SAM formation. In addition, when the first film is formed of, for example, copper or an aluminum oxide, a phosphonic acid-based compound represented by a chemical formula of "R—P(=O)(OH_2)" may be used as the organic compound for SAM formation. In addition, when the first film is formed of, for example, an aluminum oxide or a hafnium oxide, an isocyanate-based compound represented by a chemical formula of "R—N=C=O" may be used as the organic compound for SAM formation.

In the present embodiment, the first film is a film more likely to adsorb the SAM than the second film. Combinations illustrated in Tables 1 to 4 described below may be conceivable as combinations of materials for the first film, the second film, the third film, and the SAM. In addition, in the combinations illustrated in Tables 1 to 4 described below, it is assumed that the material of the first film differs from the material of the second film and that the material of the first film differs from the material of the third film.

TABLE 1

| SAM | First Film | Second Film | Third Film |
|---|---|---|---|
| thiol-based compound | copper | silicon nitride film | silicon |
| | gold | silicon oxide film | silicon nitride film |
| | silver | aluminum oxide | silicon oxide film |
| | platinum | hafnium oxide | titanium nitride |
| | palladium | titanium nitride | aluminum-containing silicon |
| | iron | titanium oxide | |
| | nickel | nickel oxide | aluminum-containing silicon nitride film |
| | zinc | chromium oxide | |
| | GaAs | iron oxide | |
| | InP | manganese oxide | aluminum-containing silicon oxide film |
| | GaN | niobium oxide | |
| | halogenated silicon | zirconium oxide | |
| | ruthenium | tungsten oxide | |
| | cobalt | tantalum oxide | |
| | tungsten | silver oxide | |
| | | copper oxide | |
| | | tin oxide | |
| | | PZT | |
| | | ITO | |
| | | spin on carbon | |
| | | aluminum | |
| | | hafnium | |
| | | titanium | |
| | | chrome | |
| | | manganese | |
| | | niobium | |
| | | zirconium | |
| | | tungsten | |
| | | tantalum nitride | |
| | | silicon carbide | |
| | | carbon-containing silicon oxide film | |
| | | carbon-containing silicon nitride film | |
| | | silicon oxide film containing carbon and nitrogen | |

TABLE 2

| SAM | First Film | Second Film | Third Film |
|---|---|---|---|
| organosilane-based compound | aluminum oxide | copper | silicon |
| | hafnium oxide | gold | silicon nitride film |
| | titanium nitride | silver | silicon oxide film |
| | titanium oxide | platinum | aluminum-containing silicon |
| | nickel oxide | palladium | |
| | chromium oxide | iron | aluminum-containing silicon nitride film |
| | iron oxide | nickel | |
| | manganese oxide | zinc | |
| | niobium oxide | GaAs | aluminum-containing silicon oxide film |
| | zirconium oxide | InP | |
| | tungsten oxide | GaN | |
| | tantalum oxide | ruthenium | |

TABLE 2-continued

| SAM | First Film | Second Film | Third Film |
|---|---|---|---|
| | silver oxide | aluminum | |
| | copper oxide | hafnium | |
| | tin oxide | titanium | |
| | PZT | chrome | |
| | ITO | manganese | |
| | germanium oxide | niobium | |
| | spin on carbon | zirconium | |
| | ruthenium | tungsten | |

TABLE 3

| SAM | First Film | Second Film | Third Film |
|---|---|---|---|
| Phosphonic acid-based compound | copper | gold | silicon |
| | aluminum oxide | silver | silicon nitride film |
| | hafnium oxide | platinum | silicon oxide film |
| | titanium oxide | palladium | aluminum-containing silicon |
| | nickel oxide | nickel | |
| | chromium oxide | zinc | aluminum-containing silicon nitride film |
| | iron oxide | GaAs | |
| | manganese oxide | InP | |
| | niobium oxide | GaN | aluminum-containing silicon oxide film |
| | zirconium oxide | silicon nitride film | |
| | tungsten oxide | silicon oxide film | |
| | spin on carbon | | |
| | ruthenium | | |
| | aluminum | | |
| | hafnium | | |
| | titanium | | |
| | nickel | | |
| | chrome | | |
| | iron | | |
| | manganese | | |
| | niobium | | |
| | zirconium | | |
| | tungsten | | |

TABLE 4

| SAM | First Film | Second Film | Third Film |
|---|---|---|---|
| isocyanate-based compound | aluminum oxide | copper | silicon |
| | hafnium oxide | gold | silicon nitride film |
| | titanium oxide | silver | silicon oxide film |
| | nickel oxide | platinum | aluminum-containing silicon |
| | chromium oxide | palladium | |
| | iron oxide | iron | aluminum-containing silicon nitride film |
| | manganese oxide | nickel | |
| | niobium oxide | zinc | |
| | zirconium oxide | GaAs | aluminum-containing silicon oxide film |
| | tungsten oxide | InP | |
| | tantalum oxide | GaN | |
| | silver oxide | PZT | |
| | copper oxide | silicon nitride film | |
| | tin oxide | ITO | |
| | spin on carbon | ruthenium | |
| | ITO | iron oxide | |
| | | aluminum | |
| | | hafnium | |
| | | titanium | |
| | | chrome | |
| | | manganese | |
| | | niobium | |
| | | zirconium | |
| | | tungsten | |

The film forming apparatus 400 forms the third film on the second film of the substrate W on which the SAM is formed by the SAM supply apparatus 300. In the present embodiment, the film forming apparatus 400 forms the third film in a region of the second film of the substrate W by atomic layer deposition (ALD) using a raw material gas and a reactant gas. When the third film is, for example, an aluminum-containing silicon oxide film, Tris(tert-pentoxy)silanol (TPSOL) and TriMethylAluminium (TMA) gas are used as the raw material gas.

The substrate W, on which the third film formed on the second film by the film forming apparatus 400, is plasma-processed by the plasma processing apparatus 200 while a temperature of the substrate W is controlled to be 70 degrees C. or lower (e.g., 30 degrees C.). Thus, the SAM formed on the first film is decomposed, and a side portion of the third film formed in a vicinity of the SAM is modified into ammonium fluorosilicate (AFS) by active species contained in the decomposed SAM.

The heating apparatus 500 heats the substrate W with the third film having the side portion modified into ammonium fluorosilicate. In the present embodiment, the heating apparatus 500 heats the substrate W, which has the third film having the side portion modified into ammonium fluorosilicate, to a temperature within a range of, for example, 100 degrees C. or higher and 250 degrees C. or lower (e.g., 150 degrees C.). Thus, the side portion of the third film modified into ammonium fluorosilicate is sublimated and removed.

Three load lock chambers 102 are respectively connect to three other sidewalls of the vacuum transfer chamber 101 via gate valves G1. An atmospheric transfer chamber 103 is provided on an opposite side of the vacuum transfer chamber 101 with the load lock chambers 102 interposed therebetween. Each of the three load lock chambers 102 is connected to the atmospheric transfer chamber 103 via a gate valve G2. The load lock chambers 102 perform a pressure control between atmospheric pressure and vacuum when the substrate W is transferred between the atmospheric transfer chamber 103 and the vacuum transfer chamber 101.

Three ports 105 configured to attach carriers (e.g., Front-Opening Unified Pods (FOUPs)) C for accommodating the substrate W therein are provided on a side surface of the atmospheric transfer chamber 103 opposite to a side surface on which the gate valves G2 are provided. In addition, an alignment chamber 104 for aligning the substrate W is provided on a sidewall of the atmospheric transfer chamber 103. A downflow of clean air is created inside the atmospheric transfer chamber 103.

A transfer mechanism 106 such as a robot arm is provided in the vacuum transfer chamber 101. The transfer mechanism 106 transfers the substrate W among the plasma processing apparatus 200, the SAM supply apparatus 300, the film forming apparatus 400, the heating apparatus 500, and each of the load lock chambers 102. The transfer mechanism 106 includes two independently movable arms 107a and 107b.

A transfer mechanism 108 such as a robot arm is provided in the atmospheric transfer chamber 103. The transfer mechanism 108 transfers the substrate W among each of the carriers C, each of the load lock chambers 102, and the alignment chamber 104.

The film forming system 100 includes a control device 110 having a memory, a processor, and an input/output interface. The memory stores programs executed by the processor and recipes including data such as conditions for respective processes. The processor executes the programs read from the memory to control respective components of the film forming system 100 via the input/output interface based on the recipes stored in the memory.

[Film Forming Method]

Figure 2:
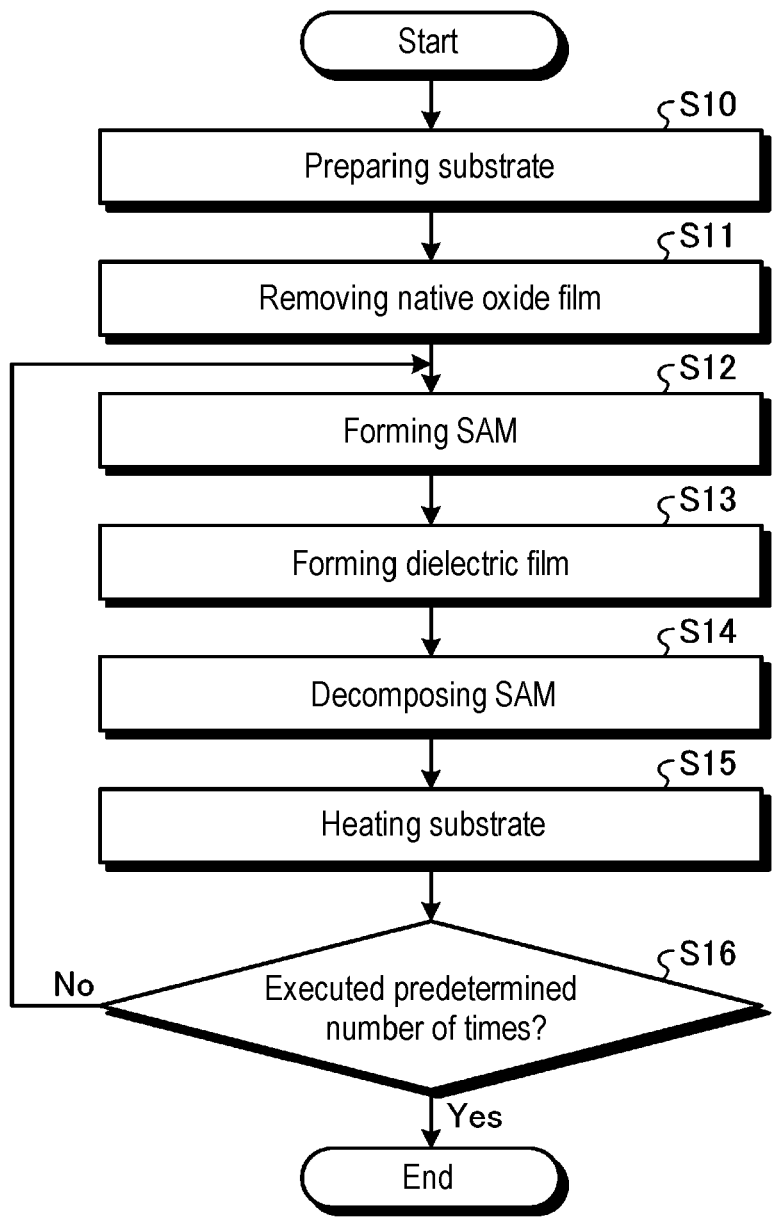
FIG. 2 is a flowchart illustrating an example of a film forming method.

FIG. 2 is a flowchart illustrating an example of a film forming method. In the present embodiment, in the substrate W having the surface from which the first film without containing silicon and the second film are exposed, the third film containing silicon is selectively formed on the second film by, for example, the film forming system 100 illustrated in FIG. 1. The film forming method illustrated in the flowchart of FIG. 2 is implemented by controlling respective components of the film forming system 100 by the control device 110. Hereinafter, an example of a film forming method according to a first embodiment will be described with reference to FIGS. 3 to 12. In addition, in the following description, a case where the first film is a metal wiring 10, the second film includes a barrier film 11 and an interlayer insulating film 12, and the third film is a dielectric film 14 will be described by way of example.

Figure 3:
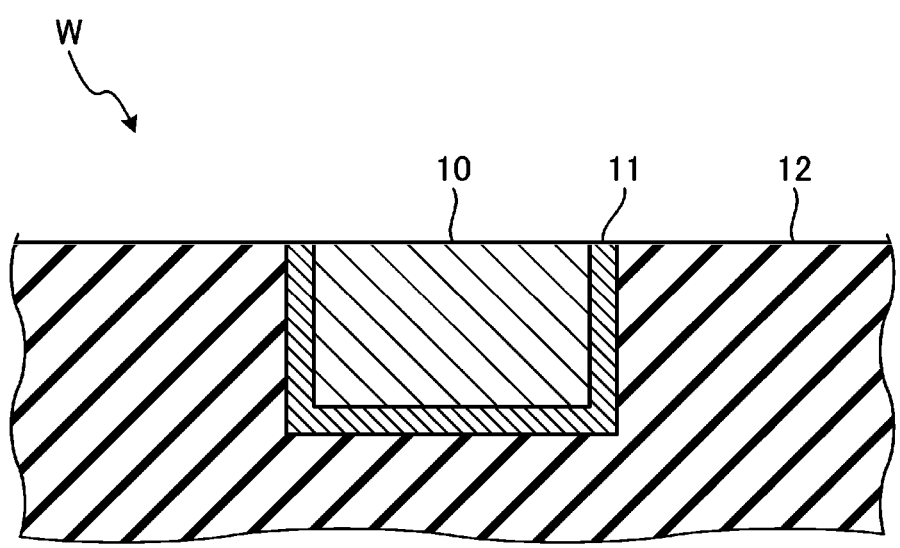
FIG. 3 is a cross-sectional view schematically illustrating an example of a substrate prepared in step S10.

First, the substrate W having a surface from which the metal wiring 10, the barrier film 11, and the interlayer insulating film 12 are exposed is prepared (step S10). Step S10 is an example of a preparation process. In step S10, for example, as illustrated in FIG. 3, the substrate W in which the barrier film 11 and the metal wiring 10 are embedded in a groove of the interlayer insulating film 12 formed of a low-k material is prepared. FIG. 3 is a cross-sectional view schematically illustrating an example of the substrate W prepared in step S10. In the present embodiment, the metal wiring 10 is formed of, for example, copper without containing silicon, the barrier film 11 is formed of, for example, a tantalum nitride without containing silicon, and the interlayer insulating film 12 is, for example, a silicon oxide film.

The substrate W prepared in step S10 is accommodated in the carrier C and is set in the port 105. Thereafter, by the transfer mechanism 108, the substrate W is taken out from the carrier C, passes through the alignment chamber 104, and then is loaded into one of the load lock chambers 102. In addition, after an interior of the load lock chamber 102 is evacuated, the substrate W is unloaded from the load lock chamber 102 and is loaded into the plasma processing apparatus 200 by the transfer mechanism 106.

Figure 4:
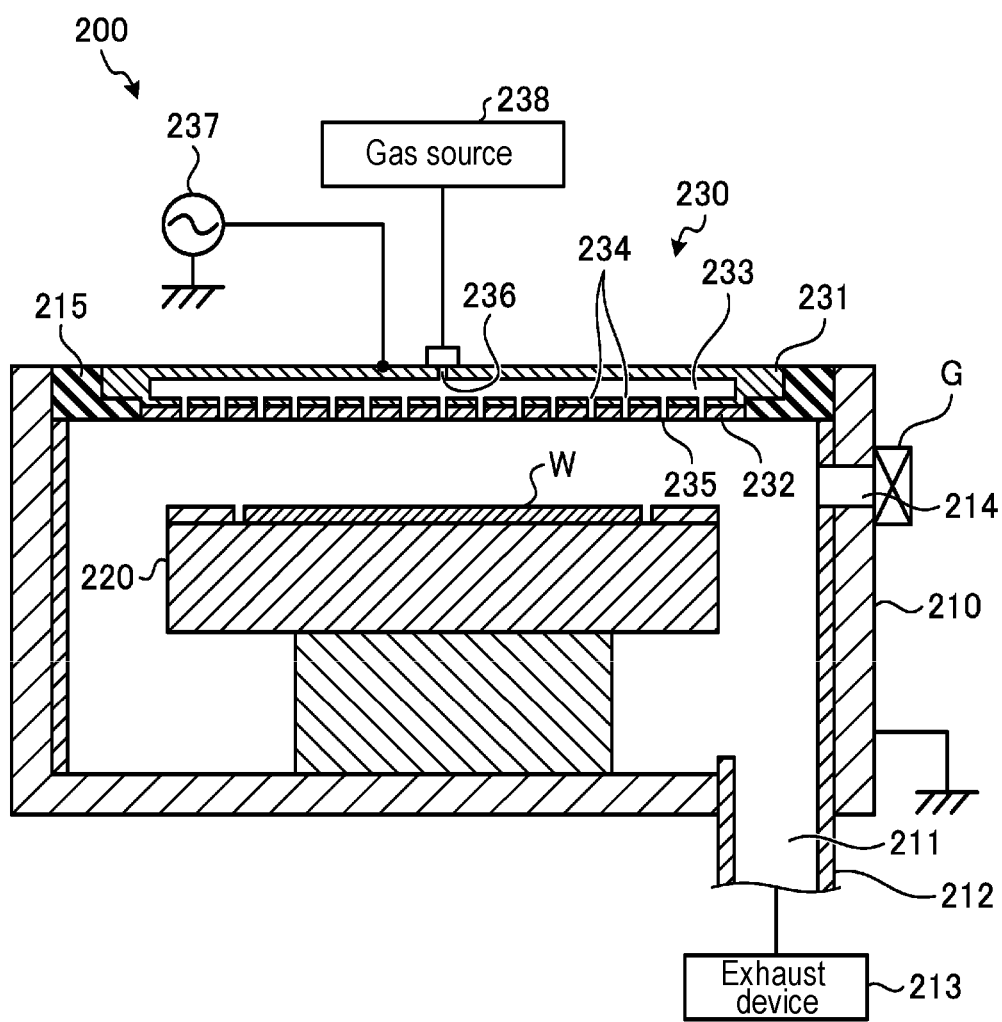
FIG. 4 is a schematic cross-sectional view illustrating an example of a plasma processing apparatus.

Subsequently, a native oxide film formed on a surface of the metal wiring 10 as well as organic substances formed in a previous process or adhered during transfer are removed by the plasma processing apparatus 200 (step S11). Step S11 is an example of a second removal process. Step S11 is executed, for example, by the plasma processing apparatus 200 as illustrated in FIG. 4. FIG. 4 is a schematic cross-sectional view illustrating an example of the plasma processing apparatus 200. The plasma processing apparatus 200 in the present embodiment is, for example, a capacitively coupled parallel plate type plasma processing apparatus. The plasma processing apparatus 200 includes a processing container 210, which has a surface formed of, for example, anodized aluminum and defines a substantially cylindrical space therein. The processing container 210 is securely grounded.

A substantially cylindrical stage 220 configured to place the substrate W thereon is provided in the processing container 210. The stage 220 may be formed of, for example, aluminum. The stage 220 is supported on a bottom of the processing container 210 via an insulator.

An exhaust port 211 is provided at the bottom of the processing container 210. An exhaust device 213 is connected to the exhaust port 211 via an exhaust pipe 212. The exhaust device 213 has, for example, a vacuum pump such as a turbo molecular pump, and is capable of evacuating an interior of the processing container 210 to a predetermined degree of vacuum. An opening 214 for loading and unloading the substrate W is formed in a sidewall of the processing container 210. The opening 214 is opened and closed by the gate valve G.

A shower head 230 is provided above the stage 220 so as to face the stage 220. The shower head 230 is supported on a top of the processing container 210 via an insulator 215. The stage 220 and the shower head 230 are provided in the processing container 210 so as to be substantially parallel to each other.

The shower head 230 includes a ceiling plate holder 231 and a ceiling plate 232. The ceiling plate holder 231 has a surface formed of, for example, anodized aluminum and detachably supports the ceiling plate 232 on a lower portion thereof.

A diffusion chamber 233 is defined in the ceiling plate holder 231. An inlet 236 in communication with the diffusion chamber 233 is formed in a top of the ceiling plate holder 231, and a plurality of flow paths 234 in communication with the diffusion chamber 233 is formed in a bottom of the ceiling plate holder 231. A gas source 238 is connected to the inlet 236 via a pipe. The gas source 238 is a source of a processing gas such as hydrogen gas.

A plurality of through-holes 235 penetrating the ceiling plate 232 in a thickness direction is formed in the ceiling plate 232. One through-hole 235 is in communication with one flow path 234. The processing gas, which is supplied from the gas source 238 into the diffusion chamber 233 via the inlet 236, diffuses in the diffusion chamber 233 and is supplied into the processing container 210 in a shower form via the flow paths 234 and the through-holes 235.

A radio frequency power supply 237 is connected to the ceiling plate holder 231 of the shower head 230. The radio frequency power supply 237 supplies radio frequency power having a predetermined frequency to the ceiling plate holder 231. The frequency of the radio frequency power ranges from 450 kHz to 2.5 GHz, for example. The radio frequency power supplied to the ceiling plate holder 231 is radiated into the processing container 210 from a lower surface of the ceiling plate holder 231. The processing gas supplied into the processing container 210 is plasmarized by the radio frequency power radiated into the processing container 210. Thereafter, the surface of the substrate W is irradiated with ions, active species, and the like contained in the plasma.

Main processing conditions in step S11 are, for example, as follows:
  Temperature of the substrate W: 100 degrees C. to 350 degrees C. (particularly 150 degrees C.);
  Pressure: 1 mTorr to 10 Torr (particularly 2 Torr);
  Flow rate of the hydrogen gas: 100 sccm to 5000 sccm (particularly 2000 sccm);
  Radio frequency power for plasma generation: 100 W to 2000 W (particularly 200 W); and
  Processing time: 1 second to 300 seconds (particularly 30 seconds).

By irradiating the substrate W with ions, active species, and the like contained in the plasma, the native oxide film formed on the metal wiring 10 as well as the organic substances formed in the previous process or adhered during the transfer are removed. After the processing of step S11 is executed, the substrate W is unloaded from the plasma processing apparatus 200 and is loaded into the SAM supply apparatus 300 by the transfer mechanism 106.

Subsequently, an SAM film is formed on the metal wiring 10 of the substrate W by the SAM supply apparatus 300 (step S12). Step S12 is an example of a first film formation process. In step S12, a gaseous organic compound for SAM formation is supplied into the SAM supply apparatus 300 with the substrate W loaded therein. For example, a thiol-based compound having a functional group containing a fluorine atom may be used as the organic compound for SAM formation. Molecules of the organic compound supplied into the SAM supply apparatus 300 are adsorbed to the surface of the metal wiring 10 on the substrate W without being adsorbed to surfaces of the barrier film 11 and the interlayer insulating film 12, thereby forming the SAM on the metal wiring 10.

Main processing conditions in step S12 are, for example, as follows:
  Temperature of the substrate W: 100 degrees C. to 350 degrees C. (particularly 150 degrees C.);
  Pressure: 1 Torr to 100 Torr (particularly 5 Torr);
  Flow rate of the gaseous organic compound: 50 sccm to 500 sccm (particularly 100 sccm); and
  Processing time: 10 seconds to 600 seconds (particularly 300 seconds).

Figure 5:
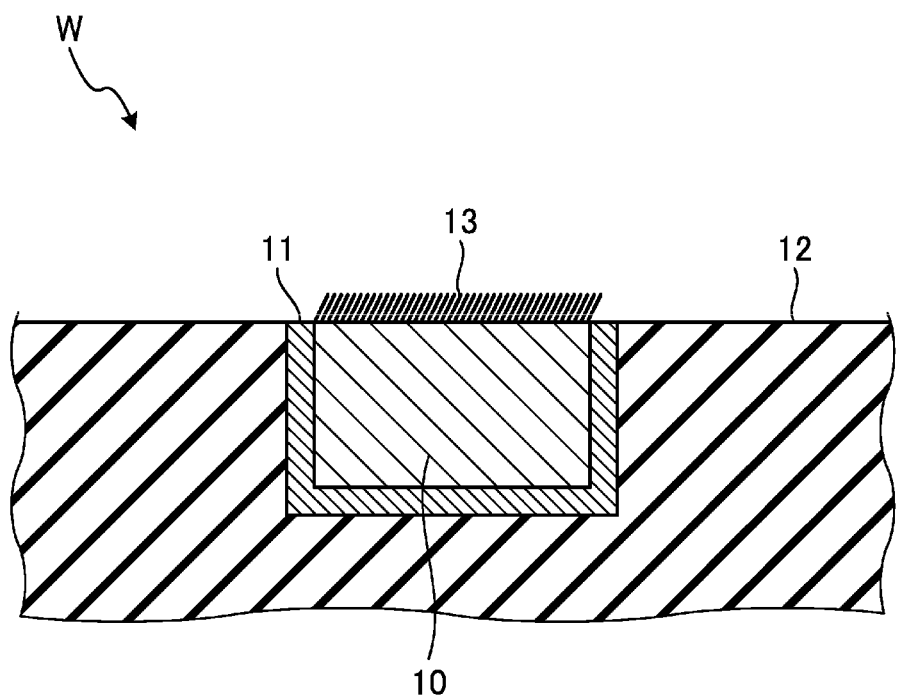
FIG. 5 is a cross-sectional view schematically illustrating an example of a substrate after an SAM is formed on a metal wiring.

Thus, the substrate W reaches a status, for example, as illustrated in FIG. 5. FIG. 5 is a cross-sectional view illustrating an example of the substrate W after an SAM 13 is formed on the metal wiring 10. After the processing of step S12 is executed, the substrate W is unloaded from the SAM supply apparatus 300 and is loaded into the film forming apparatus 400 by the transfer mechanism 106.

Subsequently, the dielectric film 14 containing silicon is formed on the barrier film 11 and the interlayer insulating film 12 of the substrate W by the film forming apparatus 400 (step S13). Step S13 is an example of a second film formation process. In step S13, the dielectric film 14 is formed on the substrate W by alternately supplying two types of material gases into the film forming apparatus 400 with the substrate W loaded therein. In the present embodiment, the dielectric film 14 is, for example, an aluminum-containing silicon oxide film, and the two types of gases supplied into the film forming apparatus 400 are, for example, TPSOL gas and TMA gas.

Main processing conditions in step S13 are, for example, as follows:
  Temperature of the substrate W: 100 degrees C. to 350 degrees C. (particularly 150 degrees C.);
  Pressure: 1 Torr to 100 Torr (particularly 5 Torr);
  Flow rate of the TPSOL gas: 100 sccm to 500 sccm (particularly 300 sccm);
  Flow time of the TPSOL gas: 1 second to 300 seconds (particularly 120 seconds);
  Flow rate of the TMA gas: 10 sccm to 200 sccm (particularly 50 sccm);
  Flow time of the TMA gas: 0.1 seconds to 30 seconds (particularly 5 seconds); and
  Processing time of step S13: 1.3 seconds to 480 seconds (particularly 133 seconds).

Figure 6:
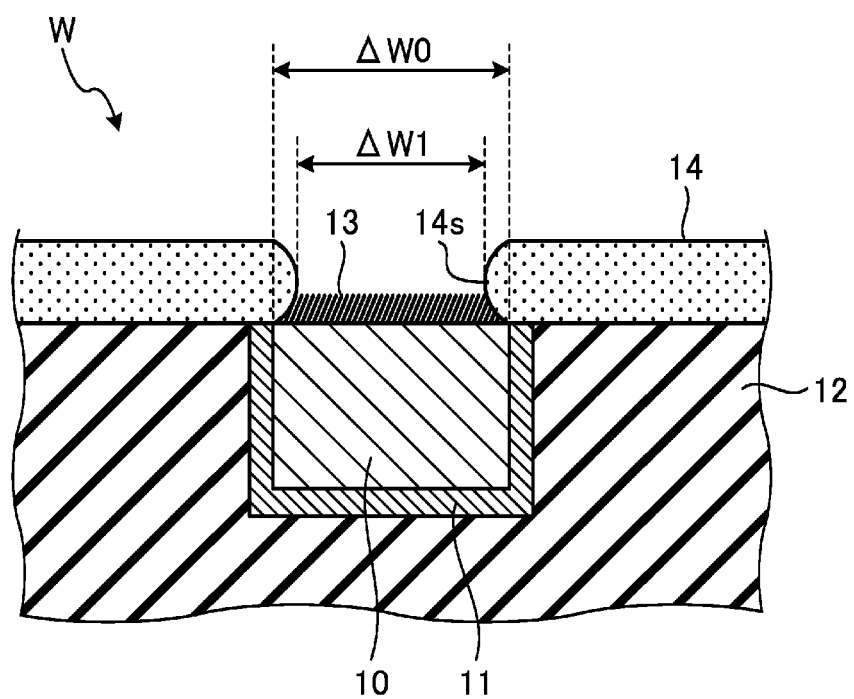
FIG. 6 is a cross-sectional view schematically illustrating an example of a substrate after a dielectric film is formed.

Thus, as illustrated in FIG. 6, for example, the dielectric film 14 is formed on the barrier film 11 and the interlayer insulating film 12. FIG. 6 is a cross-sectional view illustrating an example of the substrate W after the dielectric film 14 is formed. After the processing of step S13 is executed, the substrate W is unloaded from the film forming apparatus 400 and is loaded into the plasma processing apparatus 200 again by the transfer mechanism 106.

Here, in the course of growing the dielectric film 14 by step S13, the dielectric film 14 grows in a thickness direction as well as in a lateral direction. Thus, as illustrated in FIG. 6, for example, a part of the dielectric film 14 protrudes into a region of the metal wiring 10. Therefore, a width $\Delta W1$ of an opening of the dielectric film 14 becomes narrower than a width $\Delta W0$ of the region of the metal wiring 10.

Figure 7:
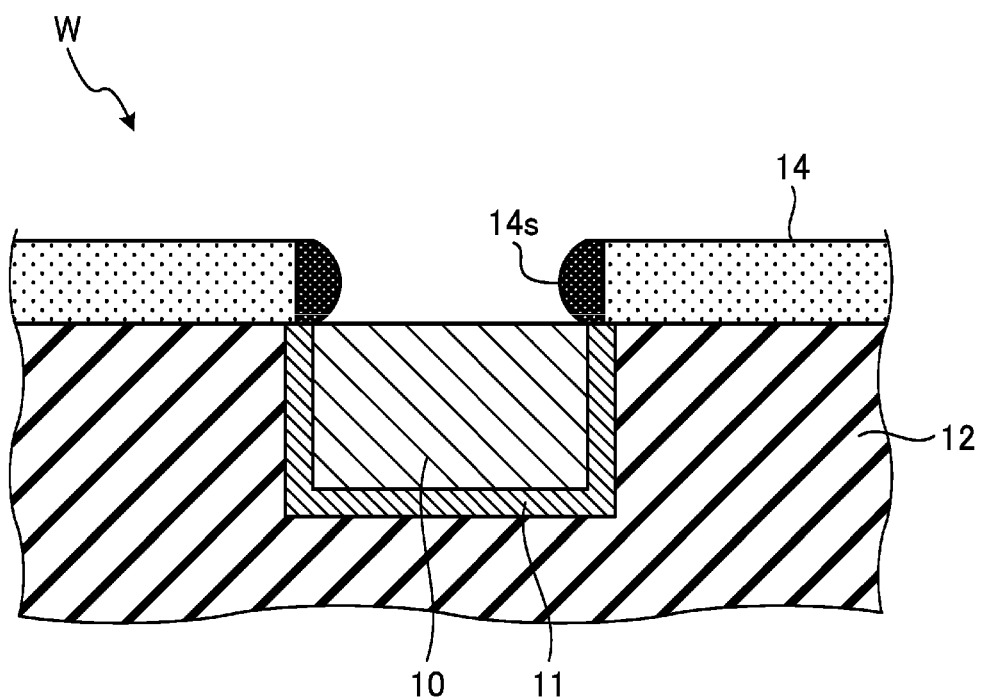
FIG. 7 is a cross-sectional view schematically illustrating an example of a substrate after the SAM is removed.

Subsequently, the SAM 13 on the metal wiring 10 of the substrate W is decomposed by the plasma processing apparatus 200 (step S14). Step S14 is an example of a modification process. In step S14, the temperature of the substrate W is controlled to be 70 degrees C. or lower (e.g., 30 degrees C.). In addition, the processing gas is plasmarized, so that the SAM 13 on the metal wiring 10 is decomposed by ions, active species, and the like contained in the plasma. In addition, the dielectric film 14 formed in a vicinity of the SAM 13 is fluorinated by active species contained in the decomposed SAM 13, thereby being modified into ammonium fluorosilicate. However, the active species contained in the decomposed SAM 13 are deactivated before reaching an upper surface of the dielectric film 14 because of a short lifespan thereof. Therefore, as illustrated in FIG. 7, for example, a side portion 14s of the dielectric film 14 formed in the vicinity of the SAM 13 is mainly modified into ammonium fluorosilicate by the active species contained in the decomposed SAM 13.

In step S14, the processing gas supplied into the processing container 210 is a gas containing hydrogen and nitrogen. In the present embodiment, the processing gas supplied into the processing container 210 in step S14 is, for example, ammonia gas, hydrazine gas, or a gas mixture of hydrogen gas and nitrogen gas.

Main processing conditions in step S14 are, for example, as follows:
Temperature of the substrate W: 0 degrees C. to 70 degrees C. (particularly 30 degrees C.);
Pressure: 0.1 Torr to 10 Torr (particularly 1 Torr);
Flow rate of the ammonia gas: 100 sccm to 2000 sccm (particularly 1000 sccm);
Radio frequency power for plasma generation: 100 W to 2000 W (particularly 200 W); and
Processing time: 1 second to 60 seconds (particularly 30 seconds).

After the processing of step S14 is executed, the substrate W is unloaded from the plasma processing apparatus 200 and is loaded into the heating apparatus 500 by the transfer mechanism 106.

Subsequently, the substrate W is heated by the heating apparatus 500 (step S15). In the present embodiment, the heating apparatus 500 heats the substrate W, in which the side portion 14s of the dielectric film 14 is modified into ammonium fluorosilicate, to, for example, a temperature within a range of 100 degrees C. or higher and 250 degrees C. or lower (e.g., 150 degrees C.). In this case, an internal pressure of the heating apparatus 500 is controlled to be, for example, 0.1 Torr to 10 Torr (particularly 0.5 Torr). Thus, the side portion 14s of the dielectric film 14 modified into ammonium fluorosilicate is sublimated and removed. Step S15 is an example of a first removal process.

Figure 8:
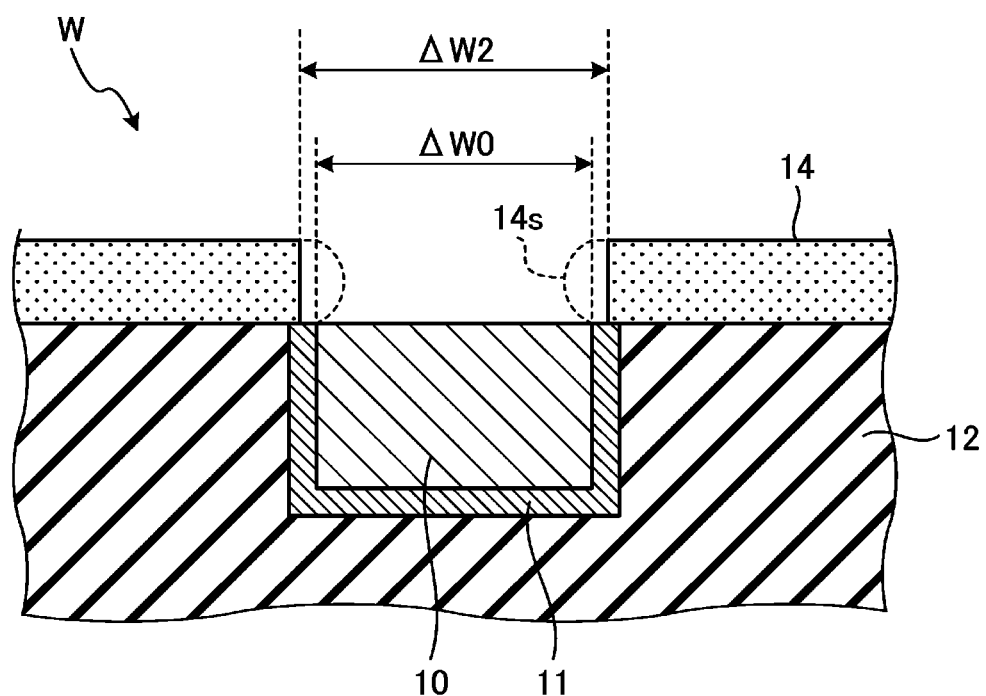
FIG. 8 is a cross-sectional view schematically illustrating an example of a substrate after a side portion of the dielectric film is removed.

Thus, as illustrated in FIG. 8, for example, a width ΔW2 of the opening of the dielectric film 14 becomes wider than the width ΔW0 of the region of the metal wiring 10. FIG. 8 is a cross-sectional view illustrating an example of the substrate W after the side portion 14s of the dielectric film 14 is removed. Therefore, when a via connected to the metal wiring 10 is formed in the opening of the dielectric film 14 in a subsequent process, a width of the via can be made wider than a width of the metal wiring 10, thereby preventing an increase in resistance value of the via.

Figure 9:
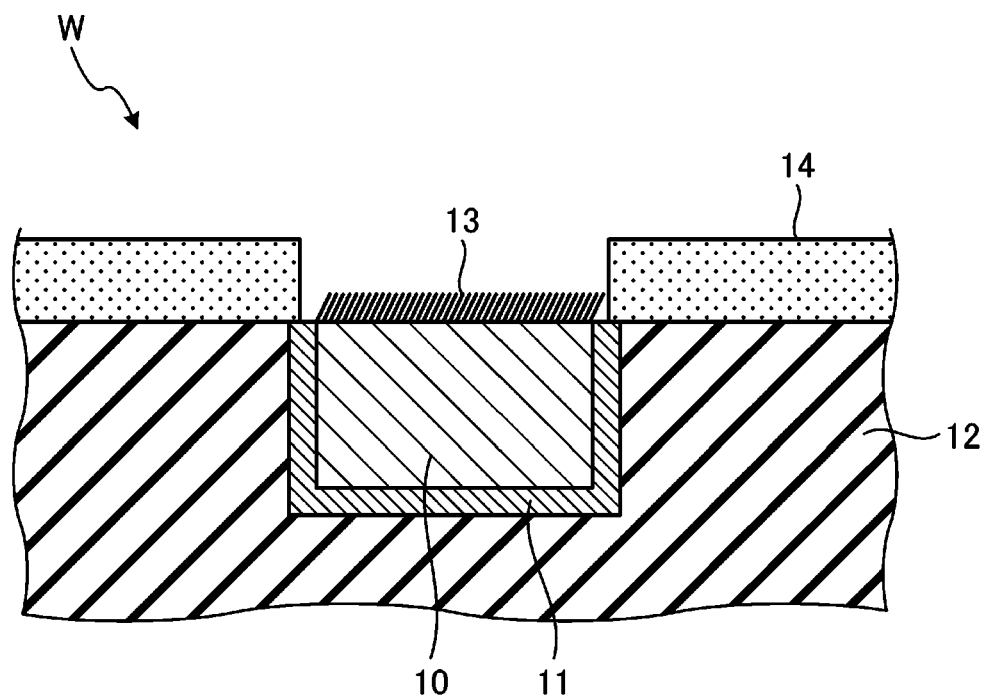
FIG. 9 is a cross-sectional view schematically illustrating an example of a substrate after an SAM is further formed on the metal wiring.

Subsequently, it is determined whether or not the processings of steps S12 to S15 have been executed a predetermined number of times (step S16). The predetermined number of times is the number of times of repeating the processings of steps S12 to S15 until the dielectric film 14 having a predetermined thickness is formed on the interlayer insulating film 12. When steps S12 to S15 have not been performed the predetermined number of times (step S16: "No"), the processing indicated by step S12 is executed again, so that as illustrated in FIG. 9, for example, the SAM 13 is again formed on the surface of the metal wiring 10.

Figure 10:
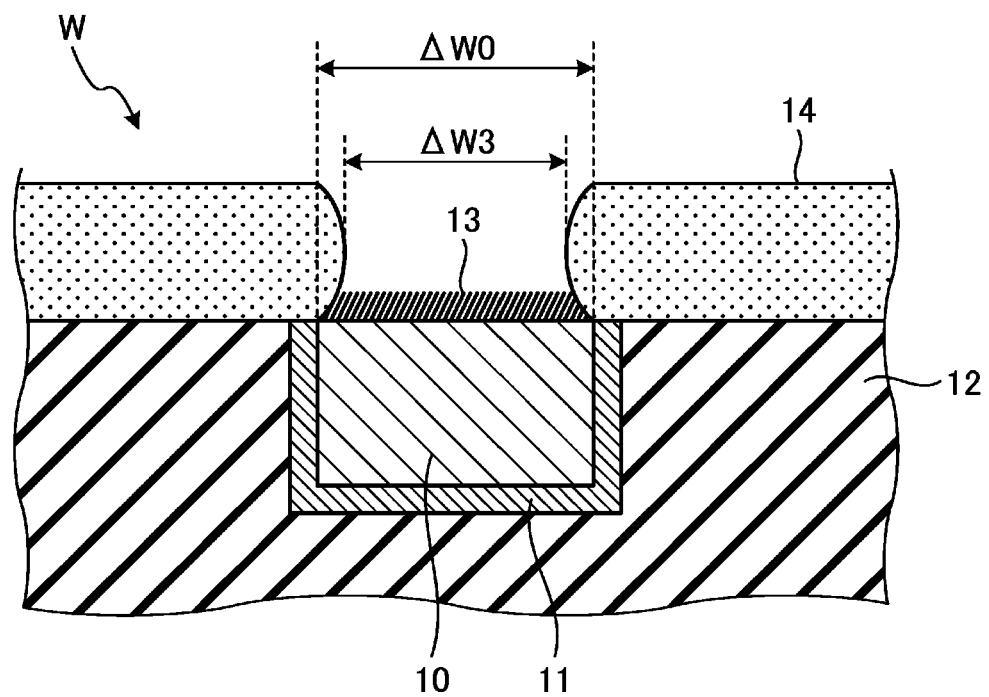
FIG. 10 is a cross-sectional view schematically illustrating an example of a substrate after a dielectric film is further formed on the dielectric film.

Thereafter, by executing the processing indicated by step S13 again, the dielectric film 14 is further formed on the barrier film 11 and the dielectric film 14. Thus, as illustrated in FIG. 10, for example, a part of the dielectric film 14 protrudes again into the region of the metal wiring 10, so that a width ΔW3 of the opening of the dielectric film 14 becomes narrower than the width ΔW0 of the region of the metal wiring 10.

Figure 11:
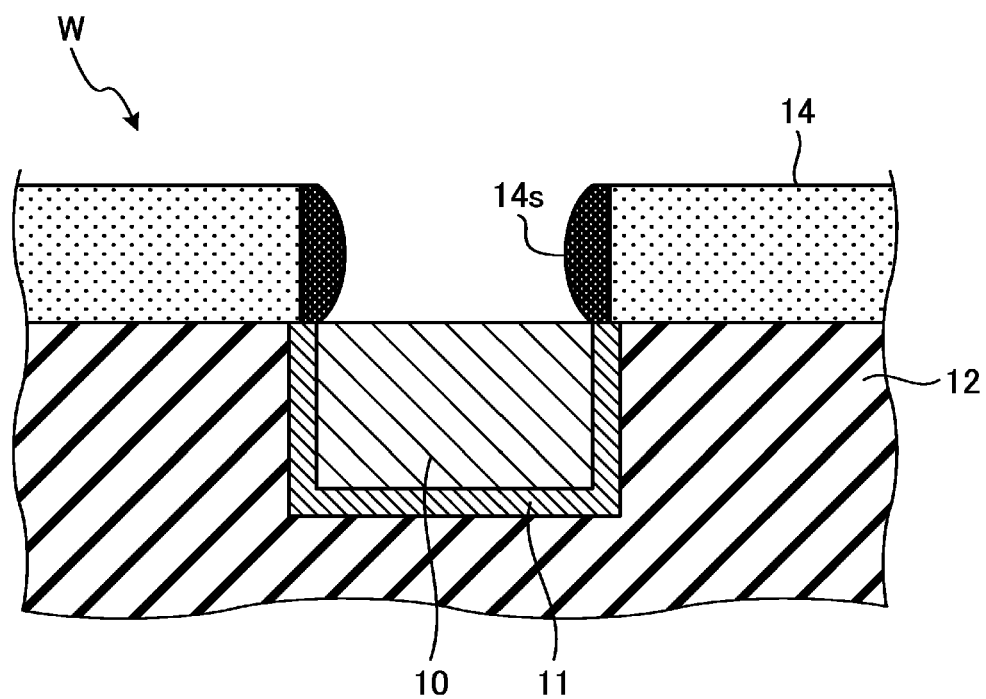
FIG. 11 is a cross-sectional view schematically illustrating an example of a substrate after the SAM is removed.

Thereafter, by executing the processing indicated by step S14 again, the SAM 13 is decomposed by the plasma, and as illustrated in FIG. 11, for example, the side portion 14s of the dielectric film 14 in the vicinity of the SAM 13 is modified into ammonium fluorosilicate.

Figure 12:
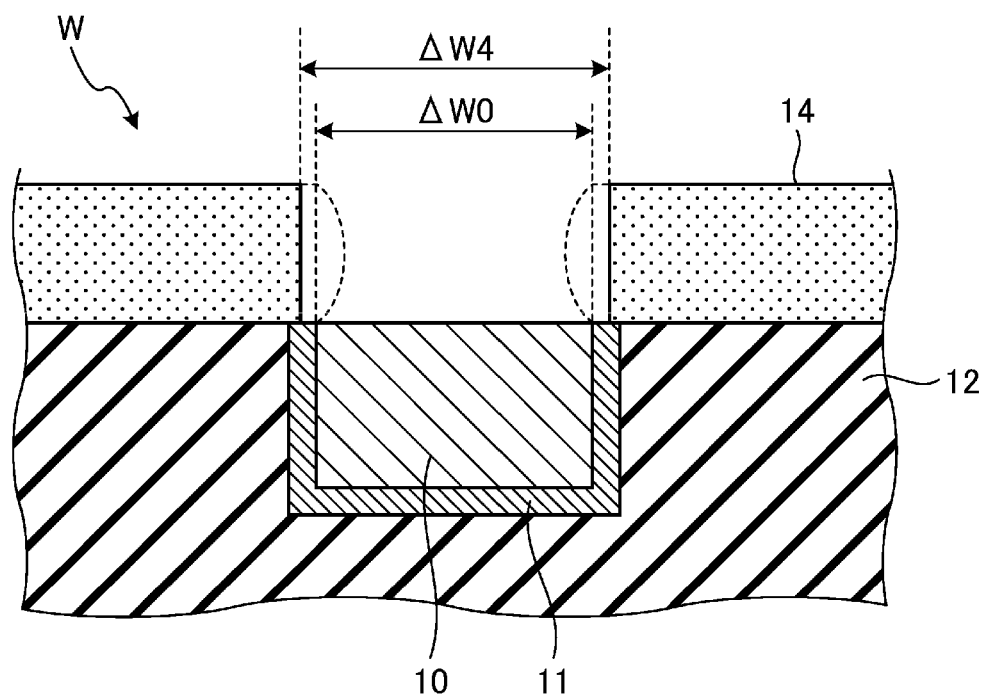
FIG. 12 is a cross-sectional view schematically illustrating an example of a substrate after a side portion of the dielectric film is removed.

Thereafter, by executing the processing indicated by step S15 again, the side portion 14s of the dielectric film 14 modified into ammonium fluorosilicate is removed. Thus, as illustrated in FIG. 12, for example, a width ΔW4 of the opening of the dielectric film 14 becomes wider than the width ΔW0 of the region of the metal wiring 10.

As described above, by repeating steps S12 to S15, it is possible to form the dielectric film 14 having an arbitrary thickness around the metal wiring 10 while maintaining the width of the opening of the dielectric film 14 to be wider than the width ΔW0 of the region of the metal wiring 10.

Figure 13:
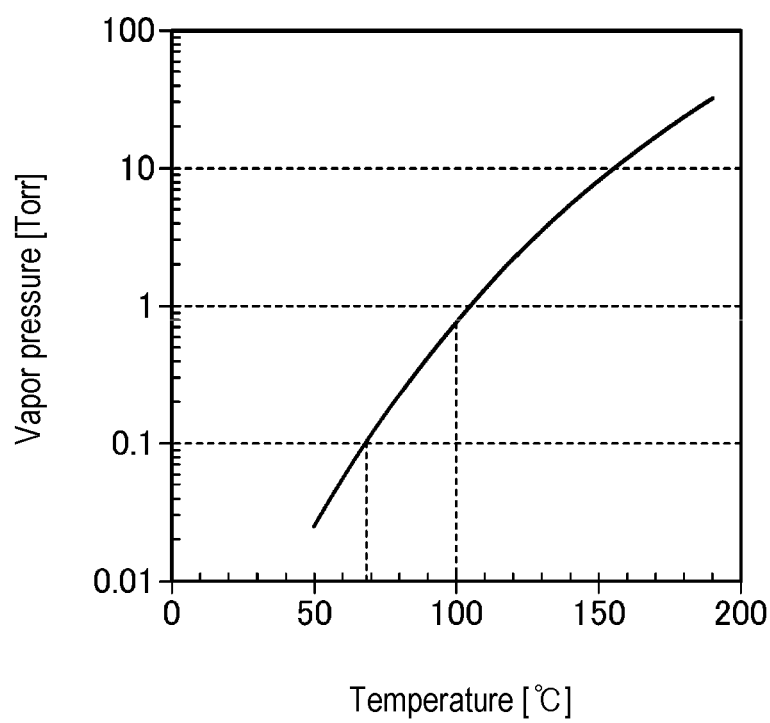
FIG. 13 is a views illustrating a vapor pressure curve of ammonium fluorosilicate.

FIG. 13 is a view illustrating a vapor pressure curve of ammonium fluorosilicate. Referring to FIG. 13, as a temperature of ammonium fluorosilicate decreases, a vapor pressure of ammonium fluorosilicate decreases. For example, the vapor pressure of ammonium fluorosilicate is about 800 mTorr when the temperature of ammonium fluorosilicate is 100 degrees C., and is about 100 mTorr when the temperature of ammonium fluorosilicate is 70 degrees C. That is, a magnitude of the vapor pressure of ammonium fluorosilicate is different by one digit between the temperatures of 100 degree C. and 70 degrees C.

For example, in a case of processing the substrate W under a low pressure condition such as 500 mTorr or less, when the temperature of the substrate W is controlled to be 70 degrees C. or lower, the vapor pressure of ammonium fluorosilicate becomes approximately 100 mTorr or less, which is lower than 500 mTorr. Thus, when the temperature of the substrate W is controlled to be 70 degrees C. or lower under the low pressure condition, it becomes difficult for ammonium fluorosilicate to be sublimated. That is, it is considered that ammonium fluorosilicate is more likely to be present on the surface of the substrate W when the temperature of the substrate W is controlled to be 70 degrees C. or lower under the low pressure condition. Therefore, it is considered that ammonium fluorosilicate is more likely to be formed on the surface of the substrate W when the temperature of the substrate W is controlled to be 70 degrees C. or lower under the low pressure condition.

On the other hand, in a case of processing the substrate W under the low pressure condition such as 500 mTorr or less, for example, when the temperature of the substrate W is controlled to be 100 degrees C. or higher, the vapor pressure of ammonium fluorosilicate becomes approximately 800 mTorr or more, which is higher than 500 mTorr. Thus, when the temperature of the substrate W is controlled to be 100 degrees C. or higher under the low pressure condition, ammonium fluorosilicate is easily sublimated. That is, it is considered that ammonium fluorosilicate is less likely to be present on the surface of the substrate W when the temperature of the substrate W is controlled to be 100 degrees C. or higher under the low pressure condition. Therefore, it is considered that ammonium fluorosilicate is more likely to be sublimated on the surface of the substrate W when the temperature of the substrate W is controlled to be 100 degrees C. or higher under the low pressure condition.

Based on the above reviews, the temperature of the substrate W may be controlled to be 70 degrees C. or lower in step S14 in which ammonium fluorosilicate is formed under the low pressure condition such as 500 mTorr or less. With this configuration, it is possible to modify a deeper portion in the side portion 14s of the dielectric film 14 into ammonium fluorosilicate by a single execution of step S14. In addition, in step S15 in which ammonium fluorosilicate is removed under the low pressure condition such as 500 mTorr or less, for example, the temperature of the substrate W may be controlled to be 100 degrees C. or higher. With this configuration, it is possible to efficiently sublimate and remove ammonium fluorosilicate formed on the side portion 14s of the dielectric film 14 by a single execution of step S15.

In the above, one embodiment of the present disclosure has been described. A film forming method of the present embodiment is a method of selectively forming a film on the substrate W, and includes the preparation process, the first film formation process, the second film formation process, the modification process, and the first removal process. In the preparation process, the substrate W having the surface from which the first film without containing silicon and the second film are exposed is prepared. In the first film formation process, the SAM 13 is formed on the metal wiring 10 by supplying the compound for forming the SAM 13, which has a fluorine-containing functional group and inhibits formation of the third film, to the substrate W. In the second film formation process, the dielectric film 14 is formed on the second film. In the modification process, the SAM 13 is decomposed by the plasma using the gas containing hydrogen and nitrogen while maintaining the temperature of the substrate W to be 70 degrees C. or lower. Thus, by active species contained in the decomposed SAM 13, the side portion of the third film formed in the vicinity of the SAM 13 is modified into ammonium fluorosilicate. In the first removal process, the ammonium fluorosilicate is removed. Therefore, it is possible to efficiently remove a portion of a film that protrudes from a region where film formation is desired to a region where the film formation is not desired.

In the first removal process of the above-described embodiment, the ammonium fluorosilicate formed on the side portion of the third film is removed by heating the substrate W to a temperature within a range of 100 degrees C. or higher and 250 degrees C. or lower. Thus, it is possible to remove the ammonium fluorosilicate formed on the side portion of the third film with a simplified apparatus.

In the above-described embodiment, the first film formation process, the second film formation process, the modification process, and the first removal process are repeated two or more times in this order. Thus, it is possible to form the dielectric film 14 having an arbitrary thickness around the metal wiring 10 while maintaining the width of the opening of the dielectric film 14 to be wider than the width of the region of the metal wiring 10.

In the above-described embodiment, the first film is a metal film without containing silicon, such as copper, cobalt, ruthenium, or tungsten. In addition, the second film is an insulating film, such as a silicon oxide film, a silicon nitride film, a silicon carbide, a carbon-containing silicon oxide film, a carbon-containing silicon nitride film, or a carbon-nitrogen-containing silicon oxide film. In addition, the third film is a dielectric film containing silicon, such as a silicon oxide film or an aluminum-containing silicon oxide film.

In the above-described embodiment, the compound for forming the SAM 13 has a bonding functional-group adsorbed to the surface of the first film and a functional functional-group containing fluorine. In addition, the compound for forming the SAM 13 is a thiol-based compound, for example. Thus, it is possible to adsorb the SAM 13 capable of fluorinating the third film to the first film.

In the above-described embodiment, the film forming method further includes a second removal process, which is executed before the first film formation process and removes a layer containing impurities such as a native oxide film formed on the first film by exposing the surface of the substrate W to plasma. Thus, it is possible to efficiently adsorb the SAM 13 to the first film.

[Others]

In addition, the technique disclosed herein is not limited to the above-described embodiment, and various modifications can be made within the scope of the gist thereof.

For example, in the above-described embodiment, the film forming system 100 is provided with one plasma processing apparatus 200, one SAM supply apparatus 300, one film forming apparatus 400, and one heating apparatus 500, but the disclosed technique is not limited thereto. For example, the film forming system 100 may be provided with a plurality of apparatus for performing a processing that takes the most time, and each of other processings may be performed by a single apparatus. For example, when the processing of step S12 takes a long time, a plurality of SAM supply apparatus 300 may be provided to perform the processing of step S12, and a single apparatus may be provided to perform each of the processings of S13 to S15. With this configuration, it is possible to improve the processing throughput when processing a plurality of substrates W. In addition, in the above-described embodiment, steps S11 and S12 are executed by the plasma processing apparatus 200 and the SAM supply apparatus 300, respectively, but the disclosed technique is not limited thereto. For example, steps S11 and S12 may be executed by the same apparatus. In addition, all of the processings illustrated in FIG. 2 may be executed by one processing apparatus. With this configuration, it is possible to omit time required for loading and unloading the substrate W, thereby improving the processing throughput. In addition, steps S11 and S12 may be executed by the plasma processing apparatus 200, step S13 may be executed by the SAM supply apparatus 300, step S14 may be executed by the film forming apparatus 400, and step S15 may be executed by the heating apparatus 500. With this configuration, it is possible to efficiently use the film forming system 100. In addition, from the viewpoint of temperature control, for example, in addition to the plasma processing apparatus 200 that performs step S11 of removing the native oxide film, a second plasma processing apparatus (instead of the heating apparatus 500) may be provided to perform step S14 of decomposing the SAM, while step S12 of forming the SAM and step 15 of heating the substrate may be performed by the SAM supply apparatus 300. With this configuration, it is possible to efficiently use the film forming system 100.

Figure 14:
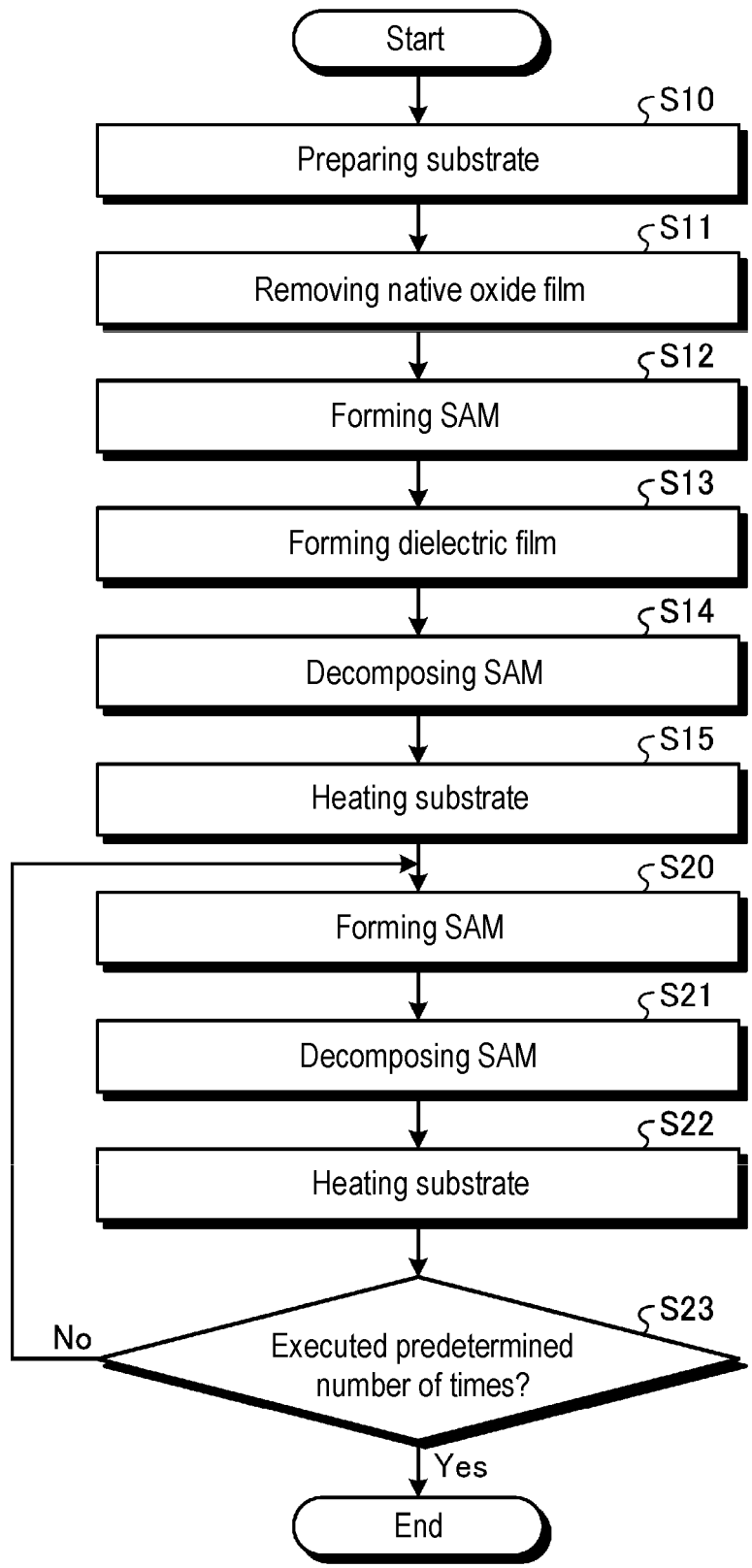
FIG. 14 is a flowchart illustrating another example of a film forming method.

In addition, in the above-described embodiment, steps S12 to S15 are repeatedly executed in this order, but the disclosed technique is not limited thereto. For example, as illustrated in FIG. 14, after steps S12 to S15 are executed, the processings indicated by steps S20 to S22 may be executed one or more times in this order. FIG. 14 is a flowchart illustrating another example of a film forming method. Step S20 is a processing of forming the SAM 13 on the metal wiring 10 and is similar to step S12. Step S21 is a processing of decomposing the SAM 13 with the plasma and modifying the side portion 14s of the dielectric film 14 into ammonium fluorosilicate by the active species contained in the decomposed SAM 13, and is similar to step S14. Step S22 is a processing of removing the side portion 14s of the dielectric film 14 modified into ammonium fluorosilicate by heating the substrate W, and is similar to step S15. In step S23, it is determined whether or not the processings of steps S20 to S22 have been executed a predetermined number of times. The predetermined number of times refers to the number of times of repeating the processings of steps S20 to S22 until the width of the opening of the dielectric film 14 becomes wider than the width ΔW0 of the region of the metal wiring 10. In the film forming method illustrated in FIG. 14, the dielectric film 14 having a sufficient thickness is formed in step S13. Thereafter, by repeating steps S20 to S22, the width of the opening of the dielectric film 14 may be made wider than the width ΔW0 of the region of the metal wiring 10.

Figure 15:
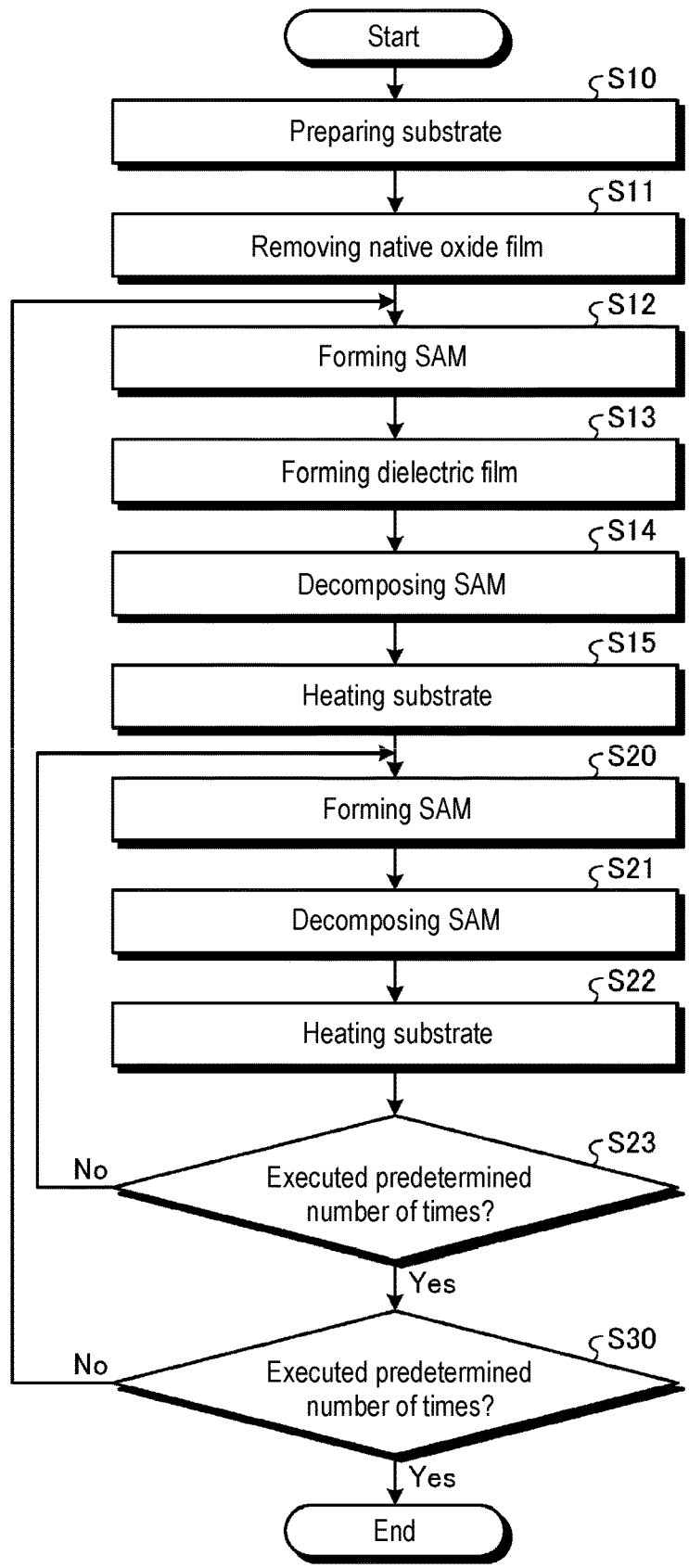
FIG. 15 is a flowchart illustrating still another example of a film forming method.

In addition, as illustrated in FIG. 15, for example, a processing S30 of determining whether or not the processings of steps S12 to S15 and the processings of steps S20 to S22 have been repeated a predetermined number of times may be executed. With this configuration, it is possible to prevent the dielectric film 14 from becoming excessively thick in step S13, and prevent the opening of the dielectric film 14 from being closed.

In addition, in the above-described embodiment, the substrate W is heated in step S15 to sublimate and remove the side portion 14s of the dielectric film 14 modified into ammonium fluorosilicate, but the disclosed technique is not limited thereto. In an alternative embodiment, for example, the side portion 14s of the dielectric film 14 modified into ammonium fluorosilicate may be removed by exposing the substrate to plasma. The plasma may be generated, for example, from a gas such as argon gas, hydrogen gas, or combinations thereof. With this configuration, it is possible to rapidly remove the ammonium fluorosilicate on the substrate W.

In addition, the embodiments disclosed herein should be considered to be exemplary and not limitative in all respects. In fact, the above-described embodiments may be implemented in various forms. In addition, the above-described embodiments may be omitted, replaced or modified in various forms without departing from the scope of the appended claims and gist thereof.

EXPLANATION OF REFERENCE NUMERALS

W: substrate, 10: metal wiring, 11: barrier film, 12: interlayer insulating film, 13: SAM, 14: dielectric film, 14s: side portion, 100: film forming system, 101: vacuum transfer chamber, 102: load lock chamber, 103: atmospheric transfer chamber, 104: alignment chamber, 105: port, 106: transfer mechanism, 107: arm, 108: transfer mechanism, 110: control device, 200: plasma processing apparatus, 210: processing container, 211: exhaust port, 212: exhaust pipe, 213: exhaust device, 214: opening, 215: insulator, 220: stage, 230: shower head, 231: ceiling plate holder, 232: ceiling plate, 233: diffusion chamber, 234: flow path, 235: through-hole, 236: inlet, 237: radio frequency power supply, 238: gas source, 300: SAM supply apparatus, 400: film forming apparatus, 500: heating apparatus

What is claimed is:

1. A film forming method of selectively forming a film on a substrate, comprising:
 a preparation process of preparing the substrate having a surface from which a first film without containing silicon and a second film are exposed;
 a first film formation process of forming a self-assembled monolayer on the first film by supplying a compound for forming the self-assembled monolayer to the substrate, wherein the compound has a fluorine-containing functional group and the self-assembled monolayer inhibits formation of a third film containing silicon;
 a second film formation process of forming the third film on the second film;
 a modification process of decomposing the self-assembled monolayer by plasma using a gas containing hydrogen and nitrogen while maintaining a temperature of the substrate to be 70 degrees C. or lower, and modifying a side portion of the third film, which is formed in a vicinity of the self-assembled monolayer, into ammonium fluorosilicate by active species contained in the decomposed self-assembled monolayer; and
 a first removal process of removing the ammonium fluorosilicate.

2. The film forming method of claim 1, wherein in the first removal process, the ammonium fluorosilicate formed on the side portion of the third film is removed by heating the substrate to a temperature within a range of 100 degrees C. or higher and 250 degrees C. or lower.

3. The film forming method of claim 2, wherein the first film formation process, the second film formation process, the modification process, and the first removal process are repeated two or more times in this order.

4. The film forming method of claim 3, wherein the first film is a metal film without containing silicon,
 wherein the second film is an insulating film, and
 wherein the third film is a dielectric film containing silicon.

5. The film forming method of claim 4, wherein the first film is formed of copper, cobalt, ruthenium, or tungsten,
 wherein the second film is a silicon oxide film, a silicon nitride film, a silicon carbide, a carbon-containing silicon oxide film, a carbon-containing silicon nitride film, or a carbon-nitrogen-containing silicon oxide film, and
 wherein the third film is a silicon oxide film or an aluminum-containing silicon oxide film.

6. The film forming method of claim 5, wherein the compound for forming the self-assembled monolayer further has a bonding functional group adsorbed to a surface of the first film.

7. The film forming method of claim 6, wherein the compound for forming the self-assembled monolayer is a thiol-based compound.

8. The film forming method of claim 7, further comprising a second removal process, which is executed before the first film formation process and removes a layer containing impurities formed on the first film by exposing the surface of the substrate to plasma.

9. The film forming method of claim 1, wherein in the first removal process, the ammonium fluorosilicate formed on the side portion of the third film is removed by exposing the substrate to plasma.

10. The film forming method of claim 1, wherein the first film formation process, the second film formation process, the modification process, and the first removal process are repeated two or more times in this order.

11. The film forming method of claim 1, wherein after the first removal process is executed, the first film formation process, the modification process, and the first removal process are executed one or more times in this order.

12. The film forming method of claim 1, wherein the first film is a metal film without containing silicon, wherein the second film is an insulating film, and wherein the third film is a dielectric film containing silicon.

13. The film forming method of claim 1, wherein the first film is formed of copper, cobalt, ruthenium, or tungsten, wherein the second film is a silicon oxide film, a silicon nitride film, a silicon carbide, a carbon-containing silicon oxide film, a carbon-containing silicon nitride film, or a carbon-nitrogen-containing silicon oxide film, and wherein the third film is a silicon oxide film or an aluminum-containing silicon oxide film.

14. The film forming method of claim 1, wherein the compound for forming the self-assembled monolayer further has a bonding functional group adsorbed to a surface of the first film.

15. The film forming method of claim 14, wherein the compound for forming the self-assembled monolayer is a thiol-based compound.

16. The film forming method of claim 1, further comprising a second removal process, which is executed before the first film formation process and removes a layer containing impurities formed on the first film by exposing the surface of the substrate to plasma.

* * * * *